(12) United States Patent
Mizugaki

(10) Patent No.: US 10,879,868 B2
(45) Date of Patent: Dec. 29, 2020

(54) VIBRATION DEVICE, ELECTRONIC APPARATUS AND VEHICLE

(71) Applicant: SEIKO EPSON CORPORATION, Tokyo (JP)

(72) Inventor: Koichi Mizugaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/728,823

(22) Filed: Dec. 27, 2019

(65) Prior Publication Data

US 2020/0212874 A1 Jul. 2, 2020

(30) Foreign Application Priority Data

Dec. 28, 2018 (JP) ................................ 2018-247481

(51) Int. Cl.
| | |
|---|---|
| *H03H 9/02* | (2006.01) |
| *H03H 9/05* | (2006.01) |
| *H03B 5/32* | (2006.01) |
| *H03H 9/10* | (2006.01) |
| *H03H 9/19* | (2006.01) |

(52) U.S. Cl.
CPC .......... *H03H 9/02125* (2013.01); *H03B 5/32* (2013.01); *H03H 9/0514* (2013.01); *H03H 9/0547* (2013.01); *H03H 9/1035* (2013.01); *H03H 9/19* (2013.01)

(58) Field of Classification Search
CPC ............. H03H 9/02125; H03H 9/0514; H03H 9/1035; H03H 9/19; H03H 9/0547; H03B 5/32
See application file for complete search history.

(56) References Cited

U.S. PATENT DOCUMENTS

2011/0163637 A1* 7/2011 Hashi ................... H03H 9/21
 310/344
2011/0234054 A1* 9/2011 Takahashi ............ H03H 9/1035
 310/348

(Continued)

FOREIGN PATENT DOCUMENTS

| | | |
|---|---|---|
| JP | 2000-223996 A | 8/2000 |
| JP | 2010-087926 A | 4/2010 |

(Continued)

*Primary Examiner* — Jeffrey M Shin
(74) *Attorney, Agent, or Firm* — Oliff PLC

(57) ABSTRACT

A vibration device includes a first substrate that includes a first surface and a second surface; a second substrate that includes a third surface and a fourth surface; an intermediate substrate that is disposed between the first substrate and the second substrate and that includes a vibration element, a frame surrounding the vibration element, and a coupler linking the vibration element and the frame; a conductive first joining member that is located between the frame and the first substrate and that joins the frame and the second surface; a conductive second joining member that is located between the frame and the second substrate and that joins the frame and the third surface; an internal electrode disposed on the first substrate; and a first conductive member that is disposed between the first substrate and the intermediate substrate and that electrically couples the vibration element and the internal electrode.

15 Claims, 14 Drawing Sheets

(56) References Cited

U.S. PATENT DOCUMENTS

| | | | |
|---|---|---|---|
| 2012/0032562 A1* | 2/2012 | Mizusawa | H03H 9/0595 |
| | | | 310/344 |
| 2013/0257549 A1* | 10/2013 | Asamura | H03H 9/0538 |
| | | | 331/68 |
| 2016/0322952 A1 | 11/2016 | Iizuka et al. | |
| 2017/0134004 A1 | 5/2017 | Isozaki et al. | |

FOREIGN PATENT DOCUMENTS

| | | |
|---|---|---|
| JP | 2010-263530 A | 11/2010 |
| JP | 2013-026761 A | 2/2013 |
| JP | 2015-122652 A | 7/2015 |
| JP | 2015-211399 A | 11/2015 |
| JP | 2017-092698 A | 5/2017 |

* cited by examiner

VIBRATION DEVICE, ELECTRONIC APPARATUS AND VEHICLE

The present application is based on, and claims priority from JP Application Serial Number 2018-247481, filed Dec. 28, 2018, the disclosure of which is hereby incorporated by reference herein in its entirety.

BACKGROUND

1. Technical Field

The present disclosure relates to a vibration device, an electronic apparatus and a vehicle.

2. Related Art

A crystal vibrator disclosed in JP-A-2000-223996 includes a base substrate, a lid substrate, and a vibration substrate sandwiched between the base substrate and the lid substrate. In addition, the vibration substrate includes a vibrator and a frame-shaped frame surrounding the vibrator. The base substrate and the frame are anodically joined, and the lid substrate and the frame are anodically joined.

A crystal vibrator disclosed in JP-A-2010-263530 includes a base substrate, a lid substrate, and a vibration substrate sandwiched between the base substrate and the lid substrate. In addition, the vibration substrate includes a vibrator and a frame-shaped frame surrounding the vibrator. The base substrate and the frame are directly joined, and the lid substrate and the frame are directly joined. In addition, an electrode that is electrically coupled to the vibrator is disposed at the base substrate, and the electrode and the vibrator are electrically coupled to each other using protrusions provided on an intermediate substrate.

However, in the crystal vibrator disclosed in JP-A-2000-223996, an electric signal of the vibration element is pulled out to the outside through a metal film used for the anodic joining. Therefore, for example, there is a problem in that parasitic capacitance is likely to occur between the metal film and other wirings, which may adversely affect the characteristics of the vibration element. On the other hand, in the crystal vibrator disclosed in JP-A-2010-263530, a metal film for joining is not used as a wiring for pulling out the electrical signal of the vibration element, but in order to pull out the electrical signal of the vibration element, protrusions are formed on the intermediate substrate. For this reason, the shape of the intermediate substrate becomes complicated, and the thickness of the intermediate substrate increases. Therefore, it is difficult to reduce the thickness of the crystal vibrator.

SUMMARY

An aspect of the present disclosure is directed to a vibration device including: a first substrate that includes a first surface and a second surface which is opposite to the first surface; a second substrate that includes a third surface and a fourth surface which is opposite to the third surface; an intermediate substrate that is disposed between the first substrate and the second substrate and that includes a vibration element, a frame that forms a frame shape surrounding the vibration element, and a coupler linking the vibration element and the frame; a conductive first joining member that is located between the frame and the first substrate and that joins a surface of the frame at the first substrate side and the second surface; a conductive second joining member that is located between the frame and the second substrate and that joins a surface of the frame at the second substrate side and the third surface; an internal electrode disposed on the first substrate; and a first conductive member that is disposed between the first substrate and the intermediate substrate and that electrically couples the vibration element and the internal electrode.

In the aspect of the present disclosure, the first substrate may be a semiconductor substrate including an oscillation circuit that is electrically coupled to the vibration element via the internal electrode. A first external terminal that is electrically coupled to the oscillation circuit and that has a fixed potential, a second external terminal that is electrically coupled to the oscillation circuit and to which supply power is input, and a third external terminal that is electrically coupled to the oscillation circuit and from which an oscillation signal is output from the oscillation circuit may be disposed on the first surface of the first substrate. The first joining member may be electrically coupled to the first external terminal.

Another aspect of the present disclosure is directed to an electronic apparatus including a vibration device, and an arithmetic processor that operates based on the oscillation signal output from the vibration device.

Still another aspect of the present disclosure is directed to a vehicle including a vibration device, and an arithmetic processor that operates based on the oscillation signal output from the vibration device.

DESCRIPTION OF EXEMPLARY EMBODIMENTS

Hereinafter, a vibration device, an electronic apparatus and a vehicle according to an aspect of the present disclosure will be described in detail based on embodiments illustrated in the accompanying drawings.

First Embodiment

Figure 1:
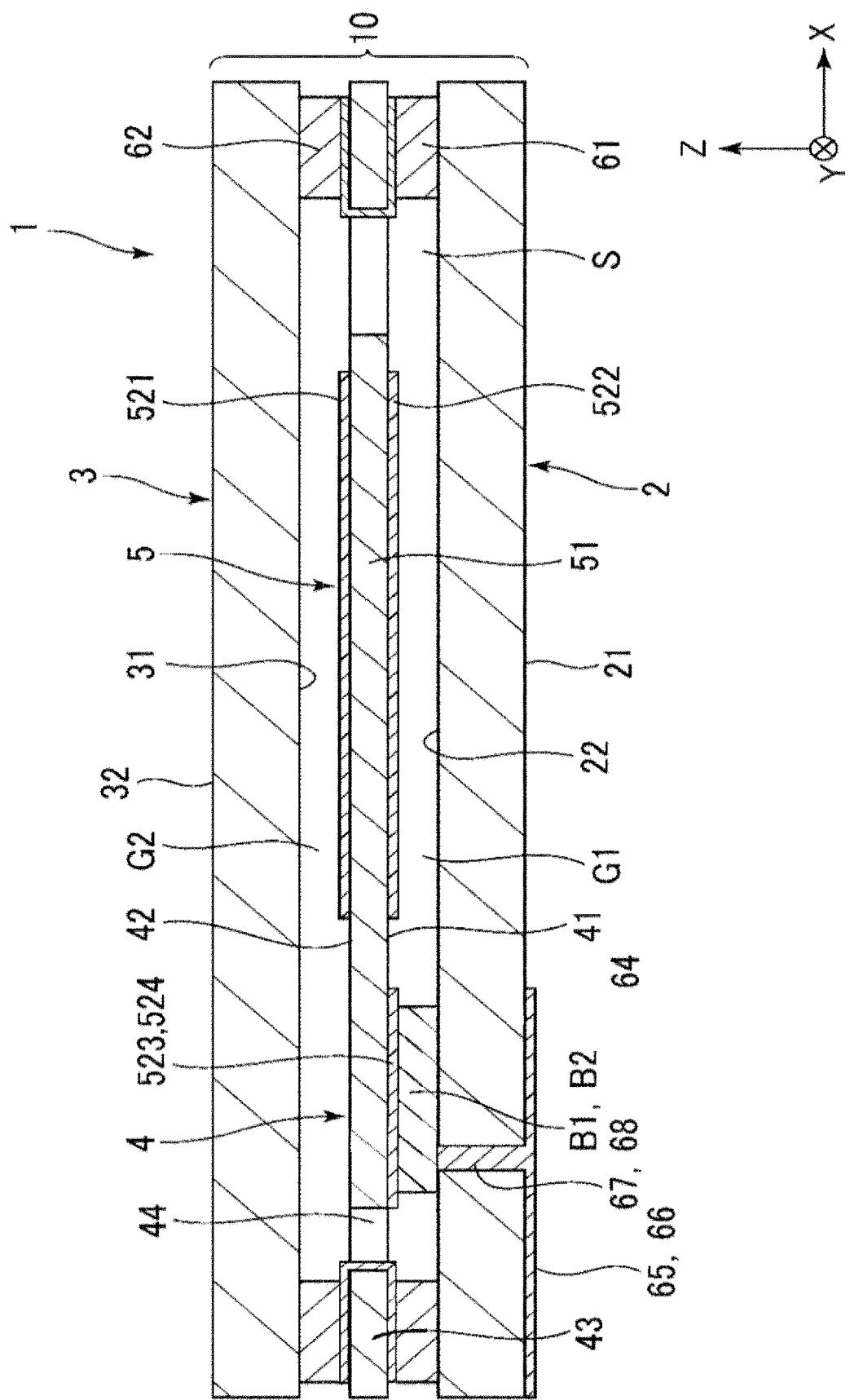
FIG. 1 is a cross-sectional view illustrating a vibration device in a first embodiment.
Figure 2:
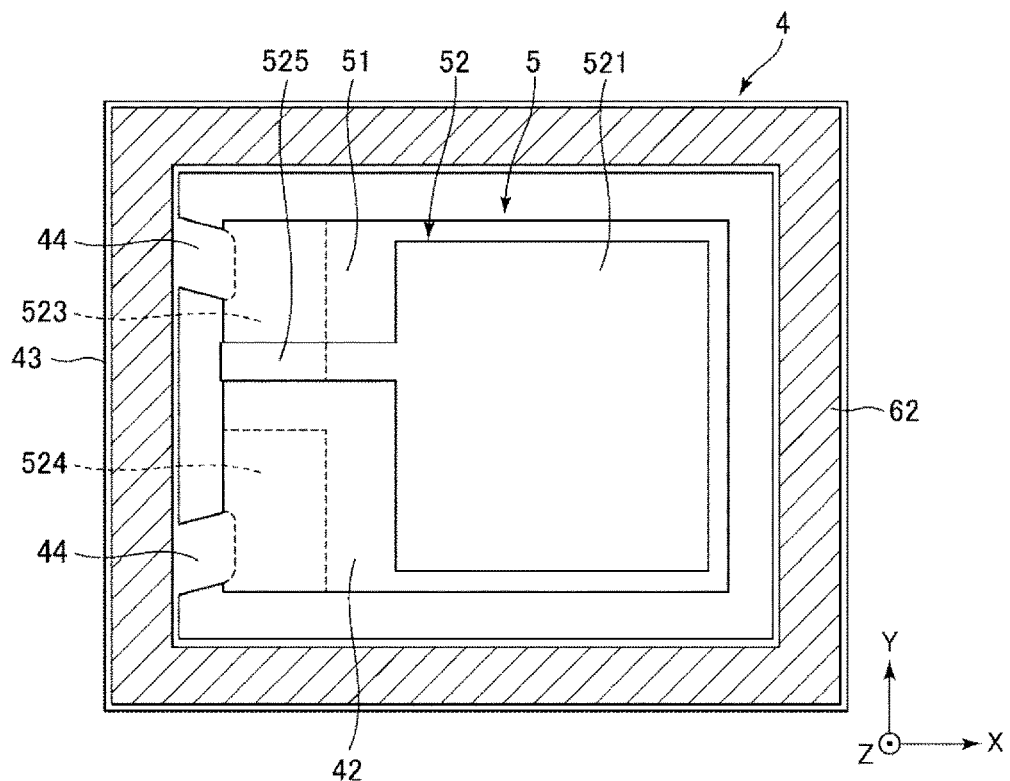
FIG. 2 is a plan view illustrating an upper surface of an intermediate substrate.
Figure 3:
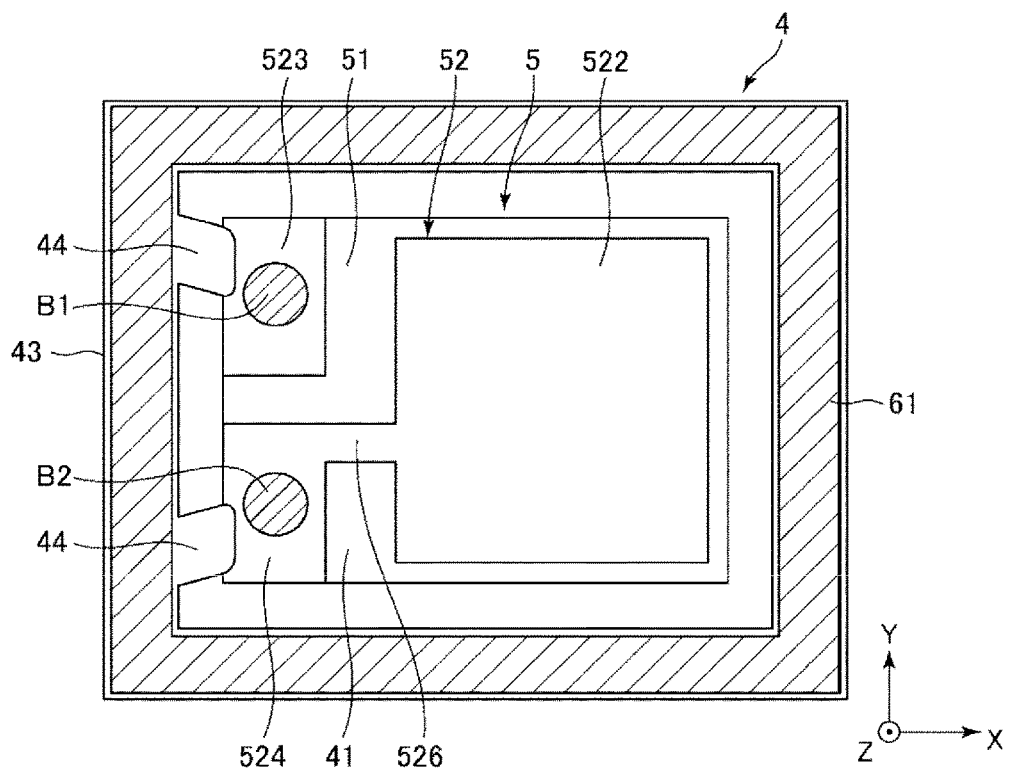
FIG. 3 is a transmission diagram of a lower surface of the intermediate substrate viewed from the upper surface side.
Figure 4:
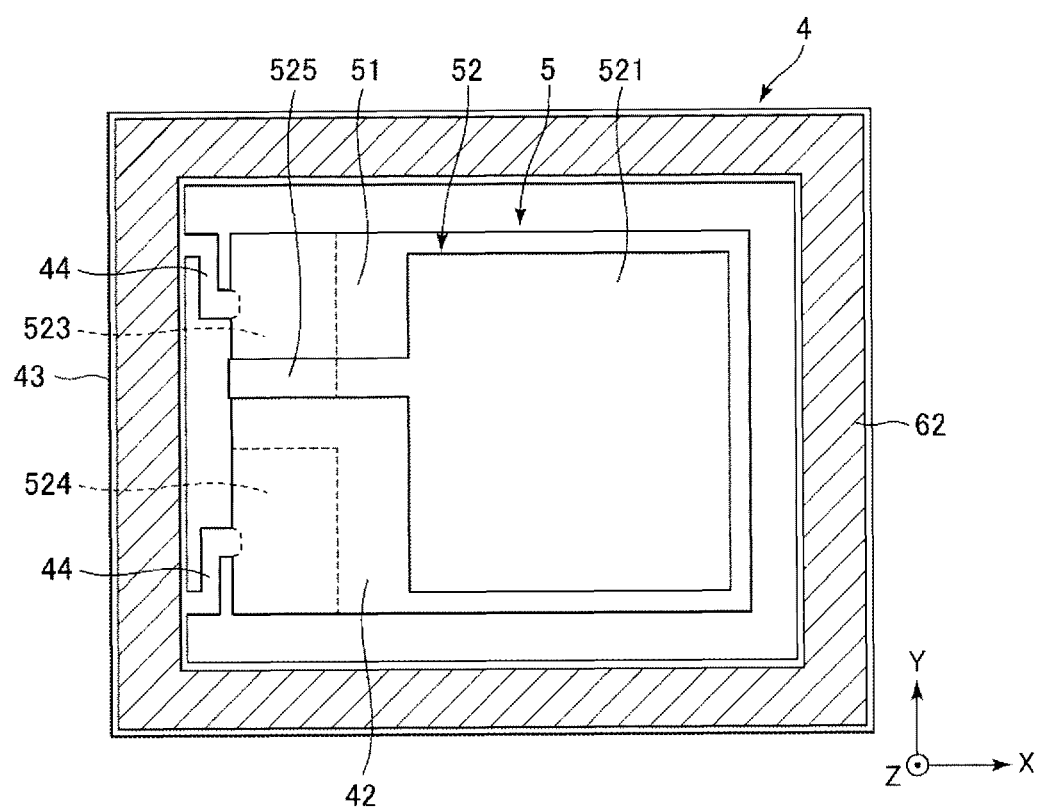
FIG. 4 is a plan view illustrating a modification example of the intermediate substrate.
Figure 5:
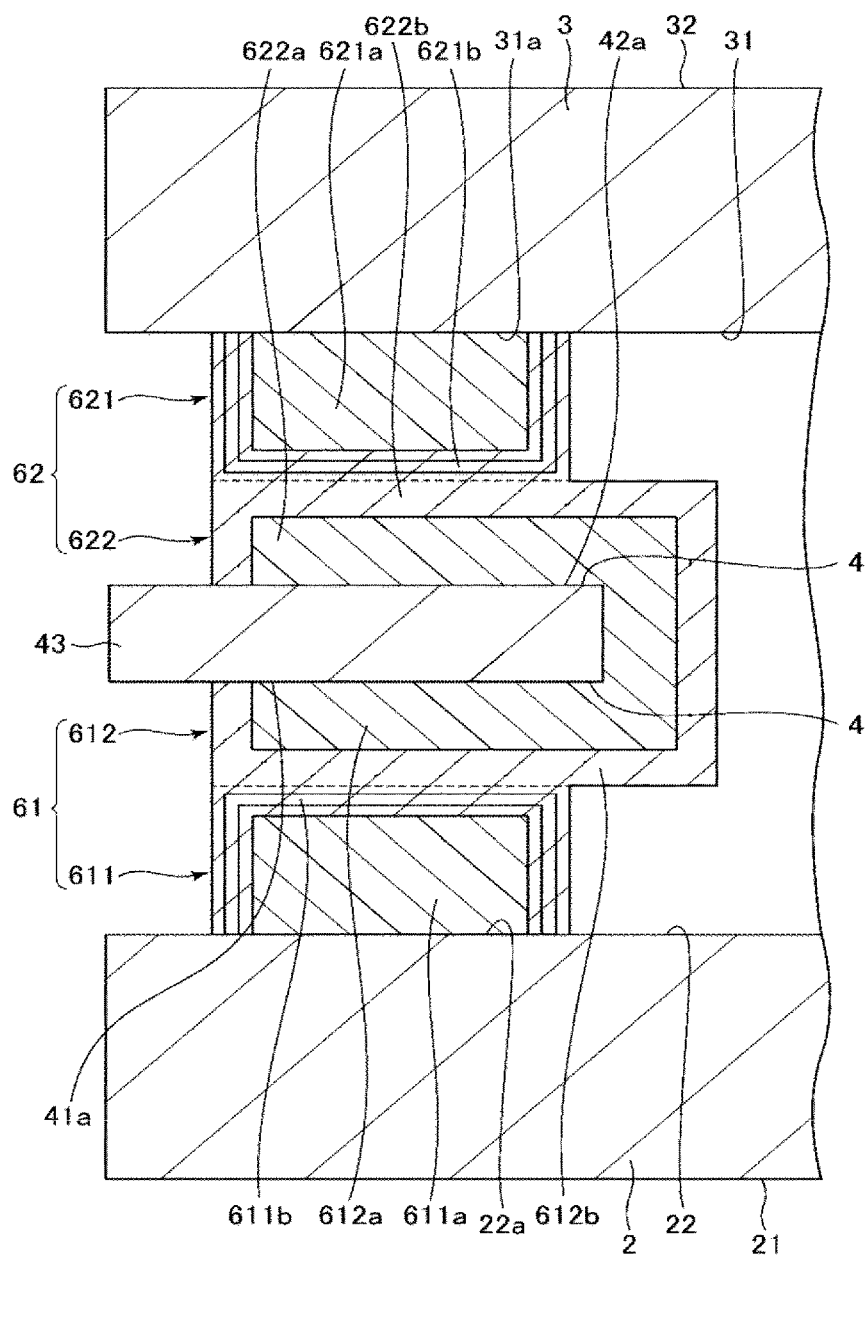
FIG. 5 is a cross-sectional view illustrating a first joining member and a second joining member.
Figure 6:
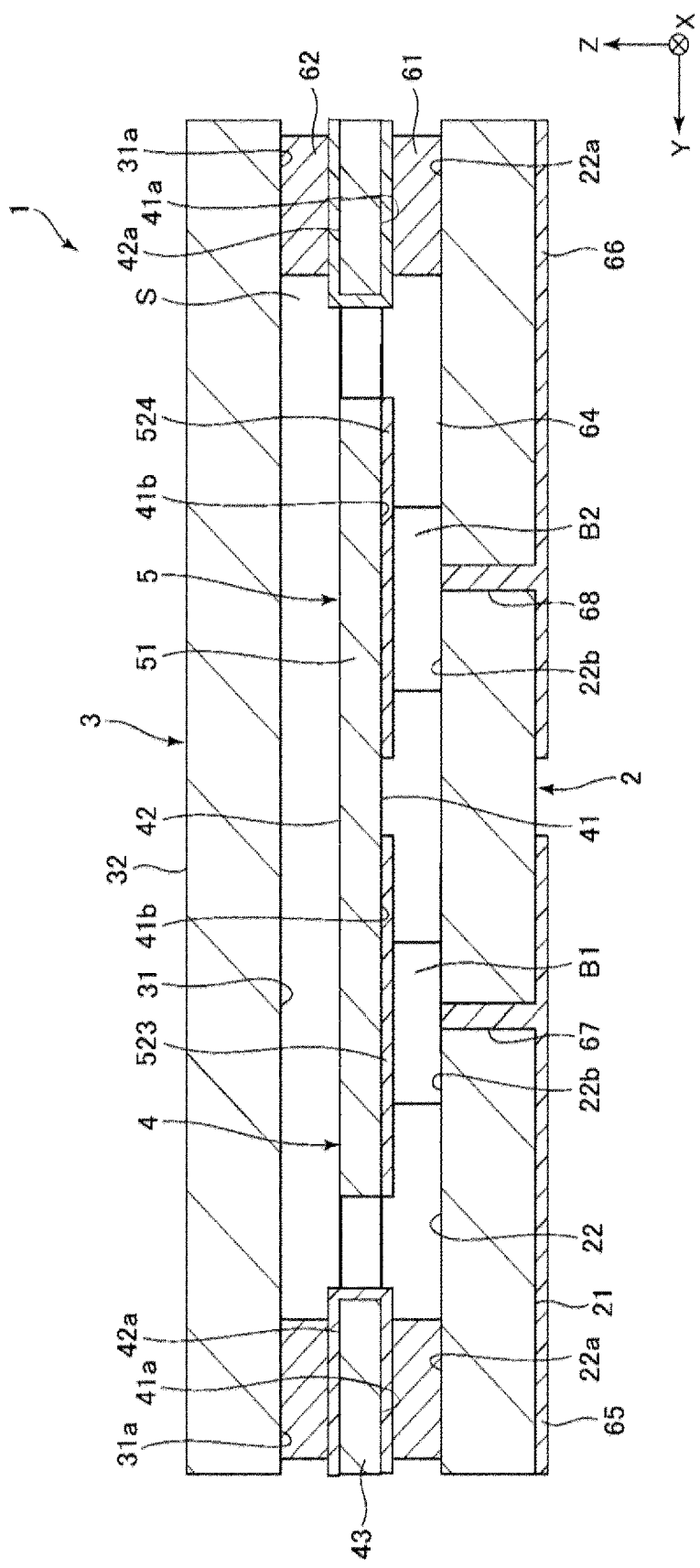
FIG. 6 is a cross-sectional view of a vibration device.
Figure 7:
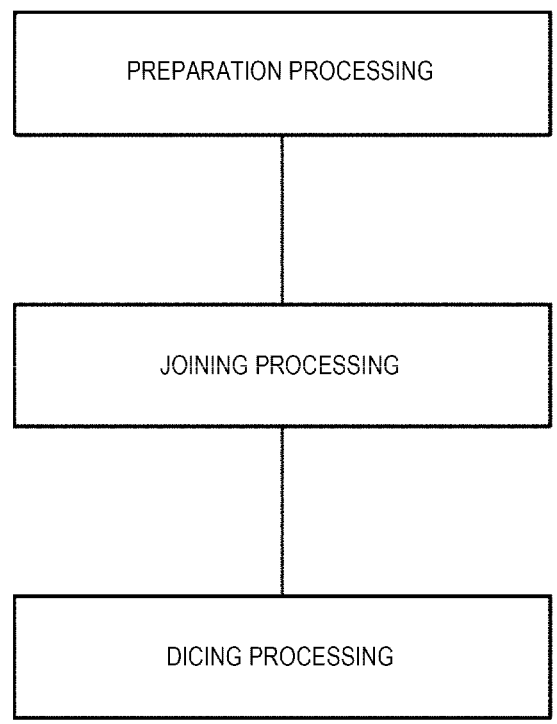
FIG. 7 is a diagram illustrating a process for manufacturing the vibration device.
Figure 8:
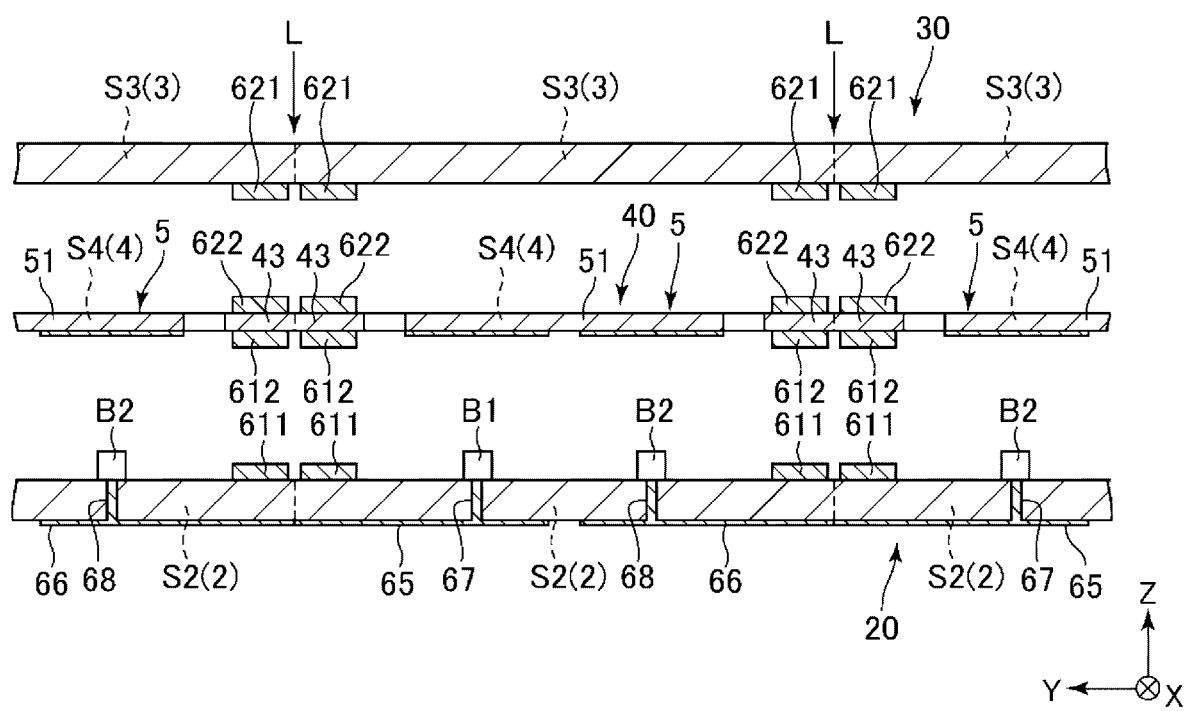
FIG. 8 is a cross-sectional view for explaining a method of manufacturing the vibration device.
Figure 9:
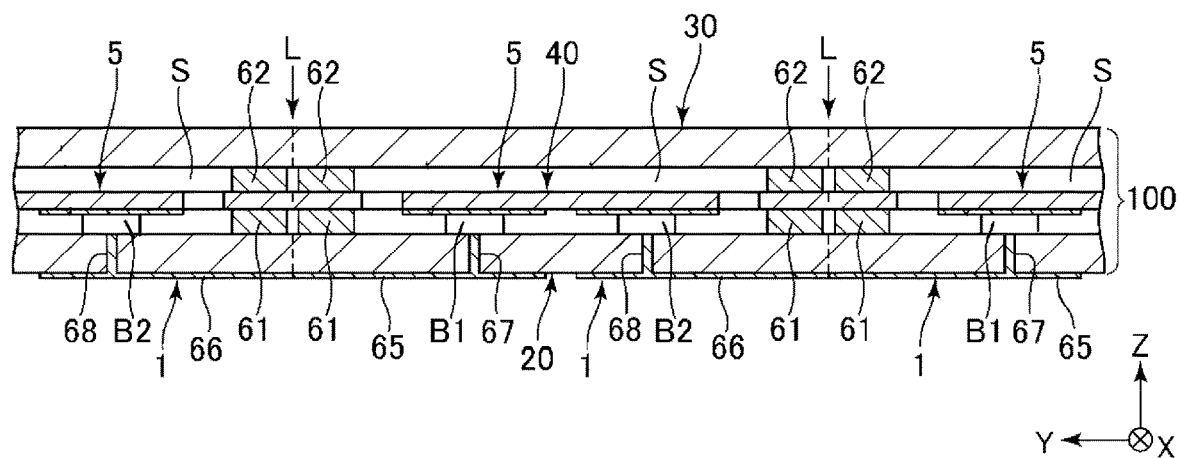
FIG. 9 is a cross-sectional view for explaining the method of manufacturing the vibration device.
Figure 10:
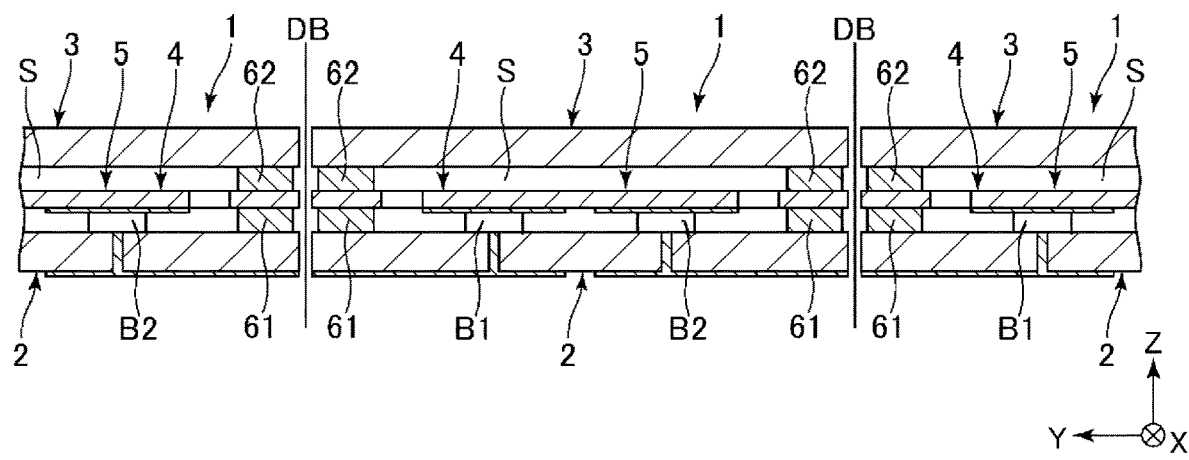
FIG. 10 is a cross-sectional view for explaining the method of manufacturing the vibration device.

FIG. 1 is a cross-sectional view illustrating a vibration device in a first embodiment. FIG. 2 is a plan view illustrating an upper surface of an intermediate substrate. FIG. 3 is a transmission diagram of a lower surface of the intermediate substrate viewed from the upper surface side. FIG. 4 is a plan view illustrating a modification example of the intermediate substrate. FIG. 5 is a cross-sectional view illustrating a first joining member and a second joining member. FIG. 6 is a cross-sectional view of a vibration device. FIG. 7 is a diagram illustrating a process for manufacturing the vibration device. FIGS. 8 to 10 are cross-sectional views for explaining a method of manufacturing the vibration device. For the convenience of explanation, three axes orthogonal to each other are illustrated in each figure, as an X axis, a Y axis, and a Z axis. In addition, in FIG. 1 and FIG. 6, a positive side of the Z axis is also referred to as "upper", and a negative side of the Z axis is also referred to as "lower".

A vibration device 1 illustrated in FIG. 1 includes a base substrate 2, a lid substrate 3, and an intermediate substrate 4, and has a structure in which the intermediate substrate 4 is installed between the base substrate 2 and the lid substrate 3. The base substrate 2 has a plate shape including a lower surface 21 which is a first surface and an upper surface 22 opposite to the lower surface 21, which is a second surface. The lid substrate 3 is located above the base substrate 2, and has a plate shape including a lower surface 31 which is a third surface located on the base substrate 2 side and an upper surface 32 opposite to the lower surface 31, which is a fourth surface. The intermediate substrate 4 is located between the base substrate 2 and the lid substrate 3, and has a plate shape including a lower surface 41 which is a fifth surface located on the base substrate 2 side and an upper surface 42 which is a sixth surface located on the lid substrate 3 side. In other words, the base substrate 2 and the lid substrate 3 are disposed to face each other via the intermediate substrate 4, the upper surface 22 and the lower surface 41 are disposed to face each other while being spaced apart, and the lower surface 31 and the upper surface 42 are disposed to face each other while being spaced apart. Of these three substrates, each of the base substrate 2 and the lid substrate 3 is a silicon substrate, and the intermediate substrate 4 is a crystal substrate.

In addition, as illustrated in FIG. 2 and FIG. 3, the intermediate substrate 4 includes a vibration element 5, a frame-shaped frame 43 that surrounds the vibration element 5, and a coupler 44 that links the vibration element 5 and the frame 43. For example, as illustrated in FIG. 4, the coupler 44 may be bent in the middle. In this way, the stress is absorbed by the coupler 44 and the stress is hardly transferred to the vibration element 5 from the frame 43. Therefore, the characteristics of the vibration element 5 are stabilized.

The vibration element 5 includes a vibration substrate 51 formed from the intermediate substrate 4 and an electrode 52 disposed on the surface of the vibration substrate 51. The vibration substrate 51 has a thickness-shear vibration mode and is formed of an AT cut crystal substrate in the present embodiment. That is, the intermediate substrate 4 uses the AT cut crystal substrate as the crystal substrate. Since the AT cut crystal substrate has third-order frequency temperature characteristics, the vibration element 5 has excellent temperature characteristics.

The electrode 52 includes an excitation electrode 521 disposed on the upper surface 42 of the vibration substrate 51, and an excitation electrode 522 disposed on the lower surface 41 so as to face the excitation electrode 521 via the vibration substrate 51. In addition, the electrode 52 includes a pair of terminals 523 and 524 disposed on the lower surface 41 of the vibration substrate 51, a wiring 525 that electrically couples the terminal 523 and the excitation electrode 521, and a wiring 526 that electrically couples the terminal 524 and the excitation electrode 522.

The configuration of the vibration element 5 is not limited to the configuration described above. For example, the vibration element 5 may be a mesa type in which a vibration area sandwiched between the excitation electrodes 521 and 522 protrudes from the periphery thereof, or conversely, may be an inverted mesa type in which the vibration area is recessed from the periphery thereof. In addition, bevel processing for grinding the periphery of the vibration substrate 51 and convex processing for making the upper surface 42 and the lower surface projection-curved surfaces, may be performed on the vibration substrate 51.

In addition, the vibration element 5 is not limited to one that vibrates in the thickness-shear vibration mode, and for example, may be a tuning fork type vibration element in which a plurality of vibrating arms bend and vibrate in the in-surface direction. The vibration substrate 51 is not limited to one that is formed of the AT cut crystal substrate, but may be formed of a crystal substrate other than the AT cut crystal substrate, for example, an X cut crystal substrate, a Y cut crystal substrate, a Z cut crystal substrate, a BT cut crystal substrate, an SC cut crystal substrate, an ST cut crystal substrate or the like. In addition, in the present embodiment, the vibration substrate 51 is made of quartz, which is a piezoelectric material, and is not limited thereto, but for example, may be made of a piezoelectric single crystal such as lithium niobate, lithium tantalate, lithium tetraborate, langalite, potassium niobate, gallium phosphate, or the like, and may be made of a piezoelectric single crystal other than those described above. The vibration element 5 uses a piezoelectric drive type one, but as another drive method, an electrostatic drive type one using an electrostatic force may be used.

As illustrated in FIG. 1, the vibration device 1 further includes: a first joining member 61 that is located between the frame 43 and the base substrate 2 and that joins the lower surface 41 of the frame 43 and the upper surface 22 of the base substrate 2; and a second joining member 62 that is located between the frame 43 and the lid substrate 3 and that joins the upper surface 42 of the frame 43 and the lower surface 31 of the lid substrate 3. Then, a package 10 is configured by joining the base substrate 2, the lid substrate 3 and the frame 43 by the first joining member 61 and the second joining member 62, and a storage space S for storing the vibration element 5 is formed inside the package 10. The storage space S is hermetically sealed and is in a reduced pressure state, that is, a vacuum state. In this way, the vibration element 5 can be driven stably. However, the atmosphere of the storage space S is not particularly limited to the description above, but for example, an inert gas such as nitrogen or Ar may be enclosed, and the atmosphere may be in an atmospheric pressure state or a pressurized state.

The first joining member 61 not only functions as a joining member that joins the frame 43 and the base substrate 2 but also functions as a spacer that forms a gap G1 between the vibration element 5 and the base substrate 2. Similarly, the second joining member 62 not only functions as a joining member that joins the frame 43 and the lid substrate 3 but also functions as a spacer that forms a gap G2 between the vibration element 5 and the lid substrate 3. As described above, the first joining member 61 and the second joining member 62 also serve as the spacers, and thus, the configuration of the package 10 becomes simple.

In addition, the first joining member 61 and the second joining member 62 have conductivity, and are made of metal in the present embodiment. Specifically, as illustrated in FIG. 5, the first joining member 61 includes a metal film 611 provided on the upper surface 22 of the base substrate 2 and a metal film 612 provided on the lower surface 41 of the frame 43, and is formed by performing diffusion joining on the upper surface of the metal film 611 and the lower surface of the metal film 612. The metal film 611 is configured by forming a plated layer 611b which is a laminate of Ni (nickel), Pd (palladium), and Au (gold) on a base 611a made of Cu (copper). The metal film 612 is a laminate in which a metal layer 612b made of Au (gold) is laminated on a metal layer 612a made of Cr (chromium). The metal film 612 is formed simultaneously with the excitation electrode 522, the wiring 526, and the pair of terminals 523 and 524. The gold plated layer on the surface of the plated layer 611b and a metal layer 612b on the surface of the metal film 612, which is made of gold, are diffusion boded. According to the configuration described above, since the surface of the first joining member 61 is covered with a layer made of gold, a weather resistance can become excellent, and thus, it is possible to effectively suppress corrosion of the first joining member 61.

As similarly, the second joining member 62 is formed by performing the diffusion joining on the metal film 621 provided on the lower surface 31 of the lid substrate 3 and the metal film 622 provided on the upper surface 42 of the frame 43. The metal film 621 is configured by forming a plated layer 621b which is a laminate of Ni, Pd, and Au on a base 621a made of Cu. The metal film 622 is a laminate in which a metal layer 622b made of Au (gold) is laminated on the metal layer 622a made of Cr (chromium). The metal film 622 is formed simultaneously with the excitation electrode 521 and the wiring 525. Then, the gold plated films on each of the surfaces are diffusion boded. The gold plated layer on the surface of the plated layer 621b and the metal layer 612b made of gold on the surface of the metal film 612 are diffusion joined. According to the configuration described above, since the surface of the second joining member 62 is covered with a layer made of gold, a weather resistance can become excellent, and thus, it is possible to effectively suppress corrosion of the second joining member 62.

In addition, the first joining member 61 and the second joining member 62 wrap around the inner surface of the frame 43 and be in contact with each other so as to be electrically coupled to each other. In this way, the base substrate 2 and the lid substrate 3 are electrically coupled to each other via the first joining member 61 and the second joining member 62.

In addition, as illustrated in FIG. 6, a pair of external coupling terminals 65 and 66 are disposed on the lower surface 21 of the base substrate 2. In addition, a pair of through-electrodes 67 and 68 that extends through from the lower surface 21 to the upper surface 22 are disposed on the base substrate 2, and thus, the through-electrode 67 and the external coupling terminal 65 are electrically coupled to each other, and the through-electrode 68 and the external coupling terminal 66 are electrically coupled to each other.

The vibration device 1 further includes bumps B1 and B2 that are a pair of first conductive members located between the base substrate 2 and the intermediate substrate 4. In addition, as illustrated in FIG. 6, a lower end of the bump B1 is in contact with the through-electrode 67, and an upper end thereof is in contact with the terminal 523 of the vibration element 5 so as to electrically couple the through-electrode 67 and the terminal 523. On the other hand, a lower end of the bump B2 is in contact with the through-electrode 68, and an upper end thereof is in contact with the terminal 524 of the vibration element 5 so as to electrically couple the through-electrode 68 and the terminal 524. In this way, the excitation electrodes 521 and 522 of the vibration element 5 are electrically pulled out to the external coupling terminals 65 and 66.

As a result, by electrically coupling the vibration element 5 and the external coupling terminals 65 and 66 via the bumps B1 and B2 respectively, there is no need to use the first joining member 61 or the second joining member 62 as pull-out wirings. Therefore, the parasitic capacitance is hardly formed between other wirings, and thus, it is possible to effectively suppress the deterioration of the characteristics of the vibration element 5.

The bumps B1 and B2 are not particularly limited as long as they have conductivity and joining properties, however, it is desirable that the bumps B1 and B2 are formed of the same material as the first joining member 61 at the same time of forming the metal film 611 of the first joining member 61. In this way, it is not necessary to perform the process of forming the bumps B1 and B2 separately from the process of forming the first joining member 61. In addition, it is possible to easily form the bumps B1 and B2 having a thickness same as that of the first joining member 61.

In the present embodiment, in plan view of the base substrate 2, the bumps B1 and B2 are disposed at a position overlapping the vibration element 5, but not limited thereto, and for example, the bumps B1 and B2 may be disposed at a position overlapping the coupler 44. In this case, the terminals 523 and 524 of the vibration element 5 are respectively pulled out to the coupler 44, which may be sufficient as long as the terminals 523 and 524 are respectively coupled to the bumps B1 and B2 at the coupler 44.

In the vibration device 1 described above, as illustrated in FIG. 5, a coupling surface 22a of the base substrate 2 coupled to the first joining member 61 and a coupling surface 41a of the frame 43 coupled to the first joining member 61 are respectively planar surfaces. As a result, it is easy to form the metal film 611 on the coupling surface 22a and to form the metal film 612 on the coupling surface 41a. The planar surface means, for example, that a surface roughness Ra is equal to or less than 200 (nm). However, not limited thereto, for example, at least one of the coupling surfaces 22a and 41a may not be a planar surface, but may be a surface having relatively large irregularities surface exceeding the above-described roughness Ra.

Similarly, the coupling surface 31a of the lid substrate 3 coupled to the second joining member 62 and the coupling surface 42a of the frame 43 coupled to the second joining member 62 are respectively planar surfaces. As a result, it is easy to form the metal film 621 on the coupling surface 31a and to form the metal film 622 on the coupling surface 42a. The planar surface means, for example, that a surface roughness Ra is equal to or less than 200 (nm). However, not limited thereto, for example, at least one of the coupling surfaces 31a and 42a may not be a planar surface, but may be a surface having relatively large irregularities exceeding the above-described roughness Ra.

In addition, as illustrated in FIG. 6, in the base substrate 2, the coupling surface 22b coupled to the bumps B1 and B2 and the coupling surface 22a coupled to the first joining member 61 described above are flush with each other. That is, the coupling surfaces 22a and 22b are located on the same X-Y plane. In addition, in the intermediate substrate 4, the coupling surface 41b coupled to the bumps B1 and B2 and the coupling surface 41a coupled to the first joining member 61 described above are flush with each other. That is, the coupling surfaces 41a and 41b are located on the same X-Y plane. With the configuration described above, as described in the method of manufacturing described later, it is possible to bond the base substrate 2 and the intermediate substrate 4 through the first joining member 61, and to easily and reliably perform the electrical coupling between the through-electrodes 67 and 68 and the vibration element 5 via the bumps B1 and B2.

The "flush surface" means that, as described above, the two surfaces are located on the same X-Y plane, and also includes a case, for example, where the two surfaces are slightly displaced which may be caused by errors during the manufacturing. However, the present disclosure is not limited to this, and the coupling surfaces 22a and 22b may not be the flush surface and the coupling surfaces 41a and 41b may not be the flush surface.

Next, the method of manufacturing the vibration device 1 will be briefly described. As illustrated in FIG. 7, the method of manufacturing the vibration device 1 includes: preparation processing for preparing the base substrate 2, the lid substrate 3 and the intermediate substrate 4; joining processing for joining the base substrate 2, the lid substrate 3 and the intermediate substrate 4; and dicing processing for dicing a plurality of integrally formed vibration devices 1.

Preparation Processing

First, as illustrated in FIG. 8, the base substrate 2, the lid substrate 3, and the intermediate substrate 4 are prepared.

As for the base substrate 2, first, a base silicon substrate 20 which is a base material of the base substrate 2 and which has a plurality of areas S2 in a matrix shape which will be diced later into the base substrates 2 is prepared. Next, the external coupling terminals 65 and 66 and the through-electrodes 67 and 68 are formed in each area S2. In addition, a frame-shaped metal film 611 is formed in each area S2 along the outer edge thereof. Next, the bumps B1 and B2 are formed on the through-electrodes 67 and 68. Adjacent metal film 611s are formed separately from each other so as not to overlap a scribe line L located at the boundary of each area.

As for the lid substrate 3, first, a lid silicon substrate 30 which is a base material of the lid substrate 3 and which has a plurality of areas S3 in a matrix shape which will be diced later into the lid substrates 3 is prepared. Next, a frame-shaped metal film 621 is formed in each area S3 along the outer edge thereof. Similar to the metal film 611 described above, the adjacent metal films 621 are formed separately from each other so as not to overlap the scribe line L.

As for the intermediate substrate 4, first, a crystal substrate 40 which is a base material of the intermediate substrate 4 and which has a plurality of areas S4 in a matrix shape which will be diced later into the intermediate substrates 4 is prepared. Then, the crystal substrate 40 is patterned by etching to form the frame 43, the coupler 44, and the vibration substrate 51 in each area S4. Then, the electrode 52 is formed on the surface of each vibration substrate 51. Thereafter, the frame-shaped metal film 612 is formed on the lower surface 41 of each frame 43, and the frame-shaped metal film 622 is formed on the upper surface 42 of each frame 43. Similarly to the metal film 611 described above, the adjacent metal films 612 are formed separately from each other so as not to overlap the scribe line L, and the adjacent metal films 622 are formed separately from each other.

Joining Processing

Next, the crystal substrate 40 is sandwiched between the base silicon substrate 20 and the lid silicon substrate 30, and the metal films 611 and 612 are diffusion joined and the metal films 621 and 622 are diffusion joined in a reduced pressure environment. In this way, as illustrated in FIG. 9, the base substrate 2 and the intermediate substrate 4 are in a state of being joined through the first joining member 61, and the lid substrate 3 and the intermediate substrate 4 are in a state of being joined through the second joining member 62. When joining the base silicon substrate 20 and the crystal substrate 40, the bumps B1 and B2 are in contact with the terminals 523 and 524 of the vibration element 5, and the through-electrodes 67 and 68 as the internal electrodes and the terminals 523 and 524 are electrically coupled via the bumps B1 and B2. As described above, a structure 100 in which a plurality of vibration devices 1 are integrally formed is obtained.

Here, as described above, since the coupling surfaces 22a and 22b in each area S2 are flush with each other and the coupling surfaces 41a and 41b in each area S4 are flush with each other, for example, if the heights of the bumps B1 and B2 are equal to or larger than the thickness of the first joining member 61, when joining the base silicon substrate 20 and the crystal substrate 40, surely it is possible to make the bumps B1 and B2 and the terminals 523 and 524 be in contact with each other. Therefore, the height management of the bumps B1 and B2 becomes easy, and thus, it is possible to make the manufacturing of the vibration device 1 easier.

Dicing Processing

Next, each vibration device 1 is diced into pieces along the scribe line L using a dicing blade DB. As described above, as illustrated in FIG. 10, a plurality of pieces of vibration device 1 are obtained. Here, the first joining member 61 and the second joining member 62 are formed so as not to overlap the scribe line L. For this reason, the dicing blade DB does not cut the first joining member 61 and the second joining member 62 during dicing. Therefore, dicing blade DB can be effectively prevented from clogging, and thus, each vibration device 1 can be diced into pieces with higher accuracy. Furthermore, even after dicing, since the surface of the first joining member 61 and the second joining member 62 can be kept covered with the gold plating film, the weather resistance of the first joining member 61 and the second joining member 62 can be maintained high.

The vibration device 1 has been described as above. The vibration device 1 described above includes: the base substrate 2 as the first substrate including the lower surface 21 which is the first surface and the upper surface 22 which is the second surface opposite to the lower surface 21; the lid substrate 3 as the second substrate including the lower surface 31 as the third surface and the upper surface 32 as the fourth surface opposite to the lower surface 31; the intermediate substrate 4 that is disposed between the base substrate 2 and the lid substrate 3 and that includes the vibration element 5, the frame 43 that forms a frame-shape surrounding the vibration element 5, and the coupler 44 that links the vibration element 5 and the frame 43; the conductive first joining member 61 that is disposed between the frame 43 and the base substrate 2 and that joins the lower surface 41 which is a surface in the frame 43 at the base substrate 2 side and the upper surface 22; the conductive second joining member 62 that is disposed between the frame 43 and the lid substrate 3 and that joins the upper surface 42 which is a surface in the frame 43 at the lid substrate 3 side and the lower surface 31; the through-electrodes 67 and 68 as the internal electrodes disposed on the base substrate 2; and the bumps B1 and B2 as the first conductive members that are disposed between the base substrate 2 and the intermediate substrate 4 and that electrically couple the vibration element 5 and the through-electrodes 67 and 68.

According to the vibration device 1 configured as described above, since the wiring is pulled out from the intermediate substrate 4 via the bumps B1 and B2, there is no need to devise the shape of the intermediate substrate 4. Therefore, the shape of the intermediate substrate 4 can be simple, and thus, it is possible to make the intermediate substrate 4 thin. Therefore, it is possible to reduce the thickness of the vibration device 1. Furthermore, since the first joining member 61 and the second joining member 62 do not need to be used as the pull-out wiring, the parasitic capacitance is hardly formed between other wirings, and thus, it is possible to effectively suppress the deterioration of the characteristics of the vibration element 5.

In addition, as described above, the coupling surface 22a of the base substrate 2 with the first joining member 61 and the coupling surface 41a of the frame 43 with the first joining member 61 are respectively planar surfaces. Therefore, it becomes easy to form the first joining member 61, more specifically, the metal films 611 and 612 that form the first joining member 61.

In addition, as described above, the coupling surface 31a of the lid substrate 3 with the second joining member 62 and the coupling surface 42a of the frame 43 with the second joining member 62 are respectively planar surfaces. Therefore, it becomes easy to form the second joining member 62, more specifically, the metal films 621 and 622 that form the second joining member 62.

In addition, as described above, the coupling surface 22b of the base substrate 2 with the bumps B1 and B2, and the coupling surface 22a of the base substrate 2 with the first joining member 61 are flush with each other, and the coupling surface 41b of the intermediate substrate 4 coupled to the bumps B1 and B2 and the coupling surface 41a of the intermediate substrate 4 coupled to the first joining member 61 are flush with each other. Therefore, it is possible to bond the base substrate 2 and the intermediate substrate 4 via the first joining member 61, and to easily and reliably perform the electrical coupling of the through-electrodes 67 and 68 and the vibration element 5 via the bumps B1 and B2.

Second Embodiment

Figure 11:
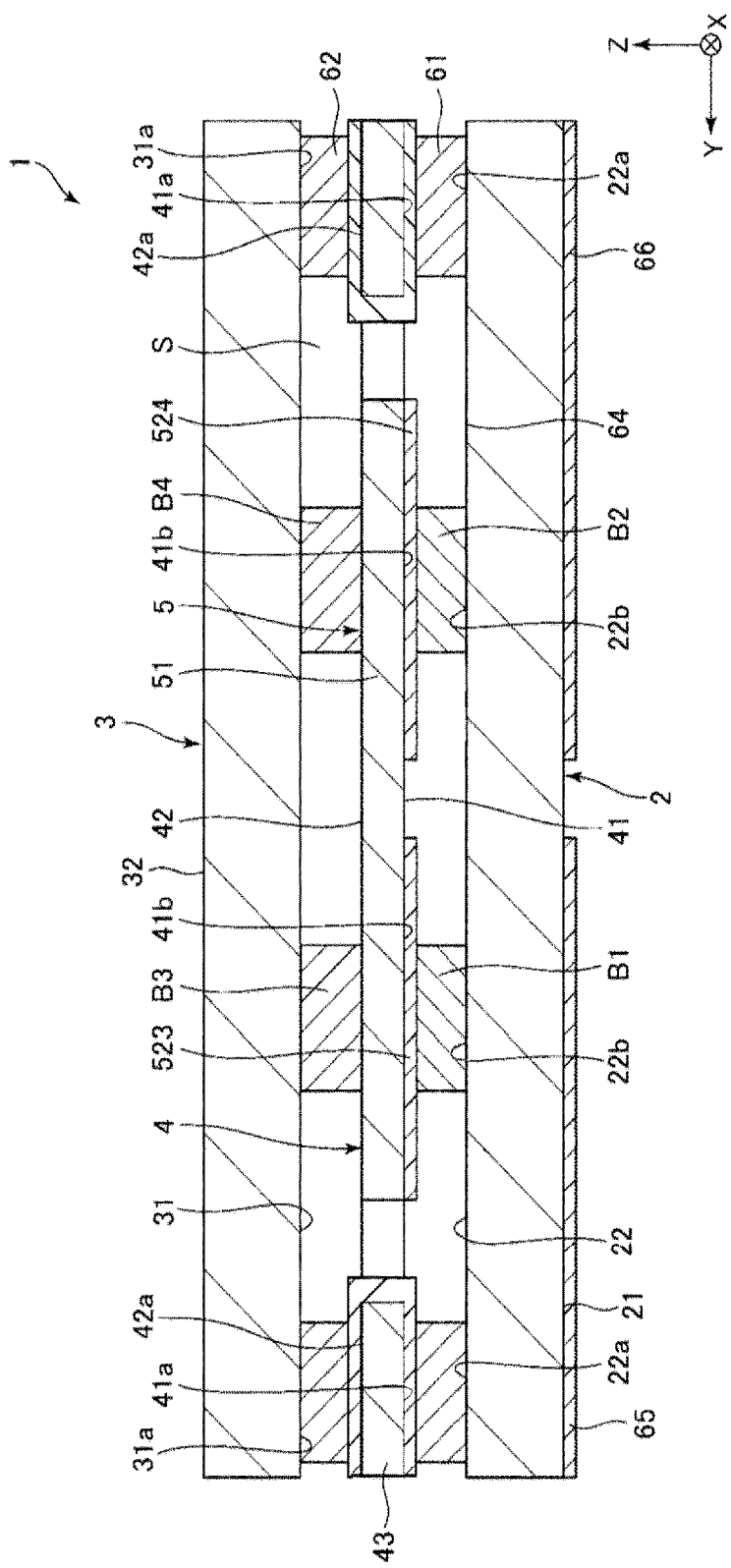
FIG. 11 is a cross-sectional view illustrating a vibration device in a second embodiment.

FIG. 11 is a cross-sectional view illustrating a vibration device in a second embodiment.

A vibration device 1 in the present embodiment is mainly the same as the vibration device 1 in the first embodiment described above except that the former includes bumps B3 and B4 as the second conductive members. In the descriptions below, the vibration device 1 in the second embodiment will be described focusing on the differences from that in the first embodiment described above, and the description of the same items will not be repeated. In addition, in FIG. 11, the same reference symbols will be given to the same configurations in the embodiment described above.

As illustrated in FIG. 11, the vibration device 1 in the present embodiment includes a pair of bumps B3 and B4 as a second conductive member disposed between the lid substrate 3 and the intermediate substrate 4. In addition, the upper surfaces of the bumps B3 and B4 are in contact with the lower surface 31 of the lid substrate 3, and the lower surfaces thereof are in contact with the upper surface 42 of the intermediate substrate 4. The bumps B3 and B4 are not electrically coupled to the vibration element 5, and do not function as wirings that electrically pull out the vibration element 5.

In addition, the bumps B3 and B4 overlap with the bumps B1 and B2 in a plan view of the base substrate 2. Therefore, the vibration element 5 is sandwiched between the bumps B1 and B2 located on the lower side and the bumps B3 and B4 located on the upper side. In this way, the posture of the vibration element 5 is stabilized by the vibration element 5 being sandwiched between the bumps B1 and B2 and the bumps B3 and B4. In addition, as in the first embodiment described above, if only the bumps B1 and B2 are used, the vibration elements 5 may be tilted by being biased by the bumps B1 and B2, but this problem is solved in the present embodiment.

The configuration of the bumps B3 and B4 is not particularly limited, but for example, the configuration may be the same as the configuration of the bumps B1 and B2, or may be a configuration different from that of the bumps B1 and B2.

As described above, the vibration device 1 in the present embodiment includes the bumps B3 and B4 that are disposed between the lid substrate 3 and the intermediate substrate 4 and that are the second conductive members overlapping the bumps B1 and B2 which are first conductive members, in plan view of the base substrate 2. In this way, the vibration element 5 can be sandwiched between the bumps B1 and B2 and the bumps B3 and B4. Therefore, the posture of the vibration element 5 is stabilized.

Third Embodiment

Figure 12:
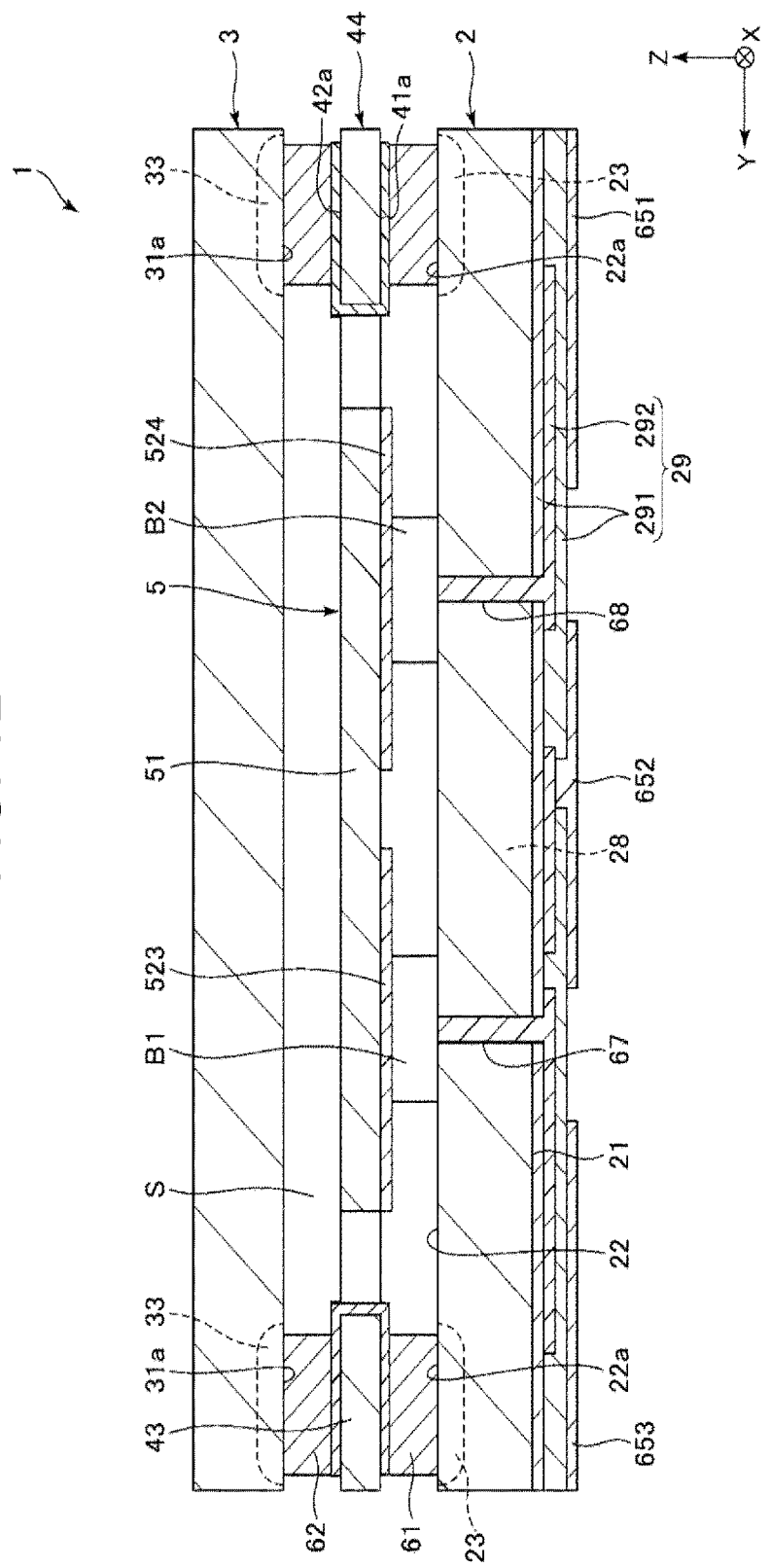
FIG. 12 is a cross-sectional view illustrating a vibration device in a third embodiment.
Figure 13:
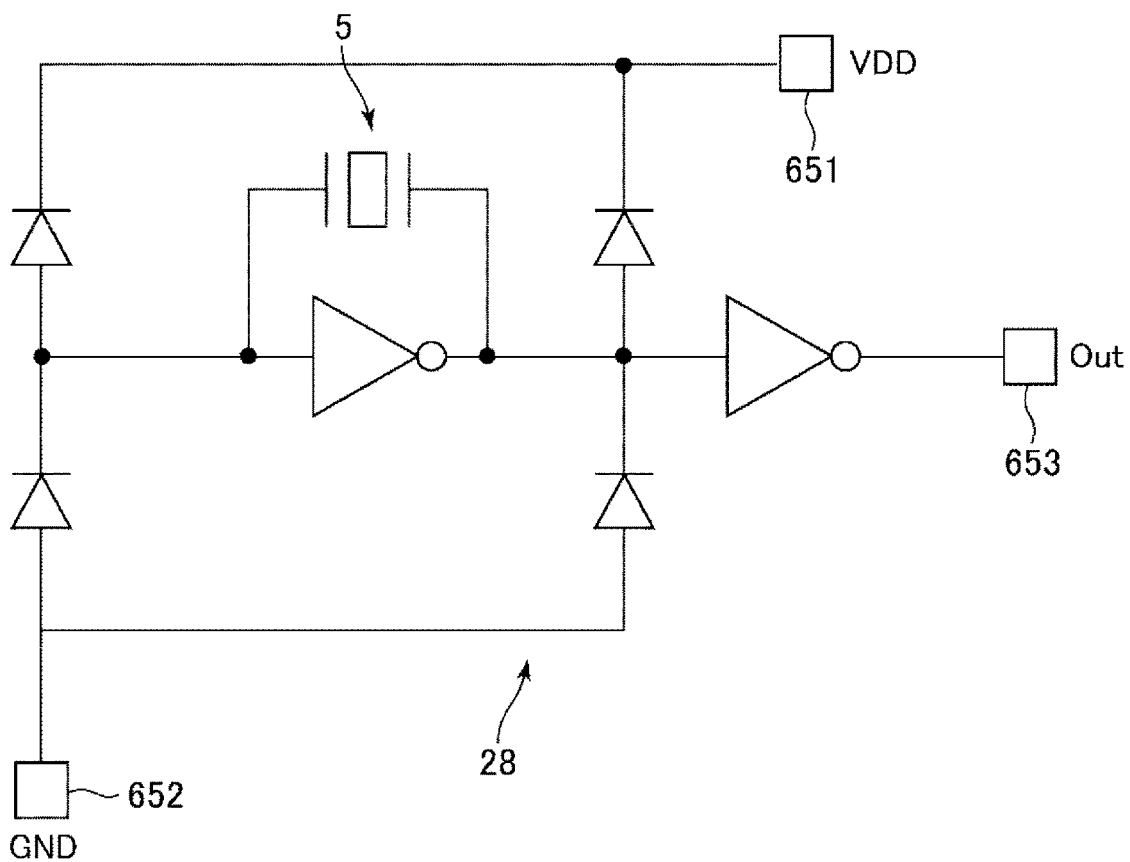
FIG. 13 is a circuit diagram illustrating an oscillation circuit.

FIG. 12 is a cross-sectional view illustrating a vibration device in a third embodiment. FIG. 13 is a circuit diagram illustrating an oscillation circuit.

A vibration device 1 in the present embodiment is mainly the same as the vibration device 1 in the first embodiment described above except that a circuit 28 is formed on the base substrate 2. In the descriptions below, the vibration device 1 in the third embodiment will be described focusing on the differences from that in the first embodiment described above, and the description of the same items will not be repeated. In addition, in FIG. 12, the same reference symbols will be given to the same configurations in the embodiment described above.

In the vibration device 1 in the present embodiment, the base substrate 2 and the lid substrate 3 are each a semiconductor substrate, and in the present embodiment, a silicon substrate is used. Particularly, a P-type silicon substrate is used as the base substrate 2 and the lid substrate 3 respectively in the present embodiment. The P-type silicon substrate is manufactured, for example, by doping a silicon substrate with P-type impurity such as boron (B) or aluminum (Al). However, the base materials for the base substrate 2 and the lid substrate 3 are not particularly limited, and thus, an N-type silicon substrate may be used, or a semiconductor substrate other than silicon, for example, a compound semiconductor substrate such as Ge, GaP, GaAs, or InP may be used.

In addition, as illustrated in FIG. 12, a circuit 28 which is electrically coupled to the vibration element 5 is formed on the base substrate 2, and in the present embodiment, the lower surface 21 is an active surface. The circuit 28 is not particularly limited, but an oscillation circuit that generates a frequency of a reference signal such as a clock signal by oscillating the vibration element 5 illustrated in FIG. 13 can be included as an example thereof. As described above, the space of the base substrate 2 can be effectively used by forming the circuit 28 on the base substrate 2.

In addition, a laminate 29 in which an insulation layer 291 and a wiring layer 292 are alternately laminated is provided on the lower surface 21 of the base substrate 2, a plurality of circuit elements (not illustrated) formed on the lower surface 21 via the wiring layer 292 are electrically coupled, and then, the circuit 28 is configured. In addition, the bumps B1 and B2 that are in contact with the upper surface 22 of the base substrate 2 are electrically coupled to the wiring layer 292 via the through-electrodes 67 and 68. That is, the bumps B1 and B2 are electrically coupled to the circuit 28 via the through-electrodes 67 and 68. In addition, three external coupling terminals 651, 652, and 653 that are electrically coupled to the circuit 28 via the wiring layer 292 are provided on the surface (lower surface) of the laminate 29. Among those three, the external coupling terminal 651 is a terminal coupled to a power supply, the external coupling terminal 652 is a terminal coupled to a ground, and the external coupling terminal 653 is a terminal to which the oscillation signal from the circuit 28 is output. The number of external coupling terminals is not limited to three, and may be adjusted as necessary.

As in the present embodiment, by making the lower surface 21 of the base substrate 2 the active surface, the electrical coupling between the circuit 28 and the external coupling terminals 651, 652, and 653 can be easily performed via the wiring layer 292.

In addition, the coupling surface 22a for coupling to the first joining member 61 of the base substrate 2 is composed of a high-concentration dope area 23 in which P-type impurities are doped at a high concentration compared to other parts. Therefore, the base substrate 2 and the first joining member 61 are in ohmic contact, and the resistance value therebetween can be suppressed to be low. Similarly, the coupling surface 31a of the lid substrate 3 coupled to the second joining member 62 is composed of a high-concentration dope area 33 in which P-type impurities are doped at a high concentration compared to other portions. Therefore, the lid substrate 3 and the second joining member 62 are in ohmic contact, and the resistance value therebetween can be suppressed to be low.

In the present embodiment, since the base substrate 2 is a P-type silicon substrate and is coupled to the external coupling terminal 652 and has ground potential, the lid substrate 3 that is electrically coupled to the base substrate 2 via the first joining member 61 and the second joining member 62 also has ground potential. In this way, the package 10 functions as a shield layer, and thus, the vibration element 5 can be protected from an external disturbance. In addition, the package 10 can block the emission of noise generated from inside of the vibration device 1, and thus, it is possible to reduce the influence on the electronic components in the periphery. The package 10 may have a constant potential other than the ground potential.

As described above, in the vibration device 1 in the present embodiment, the base substrate 2 is a semiconductor substrate on which a circuit 28 as an oscillation circuit that is electrically coupled to the vibration element 5 via the through-electrodes 67 and 68 is formed. In addition, an external coupling terminal 652 which is electrically coupled to the circuit 28 and which is a first external terminal having a fixed potential; an external coupling terminal 651 which is electrically coupled to the circuit 28 and which is a second external terminal to which power is input; and an external coupling terminal 653 as a third external terminal which is electrically coupled to the circuit 28, and to which the oscillation signal is output from the circuit 28, are disposed on the base substrate 2 at the lower surface 21 side. The first joining member 61 is electrically coupled to the external coupling terminal 652. In this way, by forming the circuit 28 on the base substrate 2, the base substrate 2 can be used effectively.

In addition, as described above, the lower surface 21 of the base substrate 2 is an active surface, the internal electrode is the through-electrodes 67 and 68 extending through the lower surface 21 and the upper surface 22 of the base substrate 2, and the circuit 28 is electrically coupled to the vibration element 5 via the through-electrodes 67 and 68. In this way, it becomes easy to electrically couple the circuit 28 and the vibration element 5. In addition, by making the lower surface 21 an active surface, the external coupling terminals 651, 652, and 653 can be easily disposed on the lower surface 21 side.

In addition, as described above, the first joining member 61 and the second joining member 62 are electrically coupled, and the lid substrate 3 is electrically coupled to the base substrate 2 via the first joining member 61 and the second joining member 62. In this way, the lid substrate 3 can be at the same potential as the base substrate 2, and for example, by coupling the base substrate 2 and the lid substrate 3 to ground, it is possible to cause the package 10 to function as a shield layer that protects the vibration element 5 from the external disturbance.

Fourth Embodiment

Figure 14:
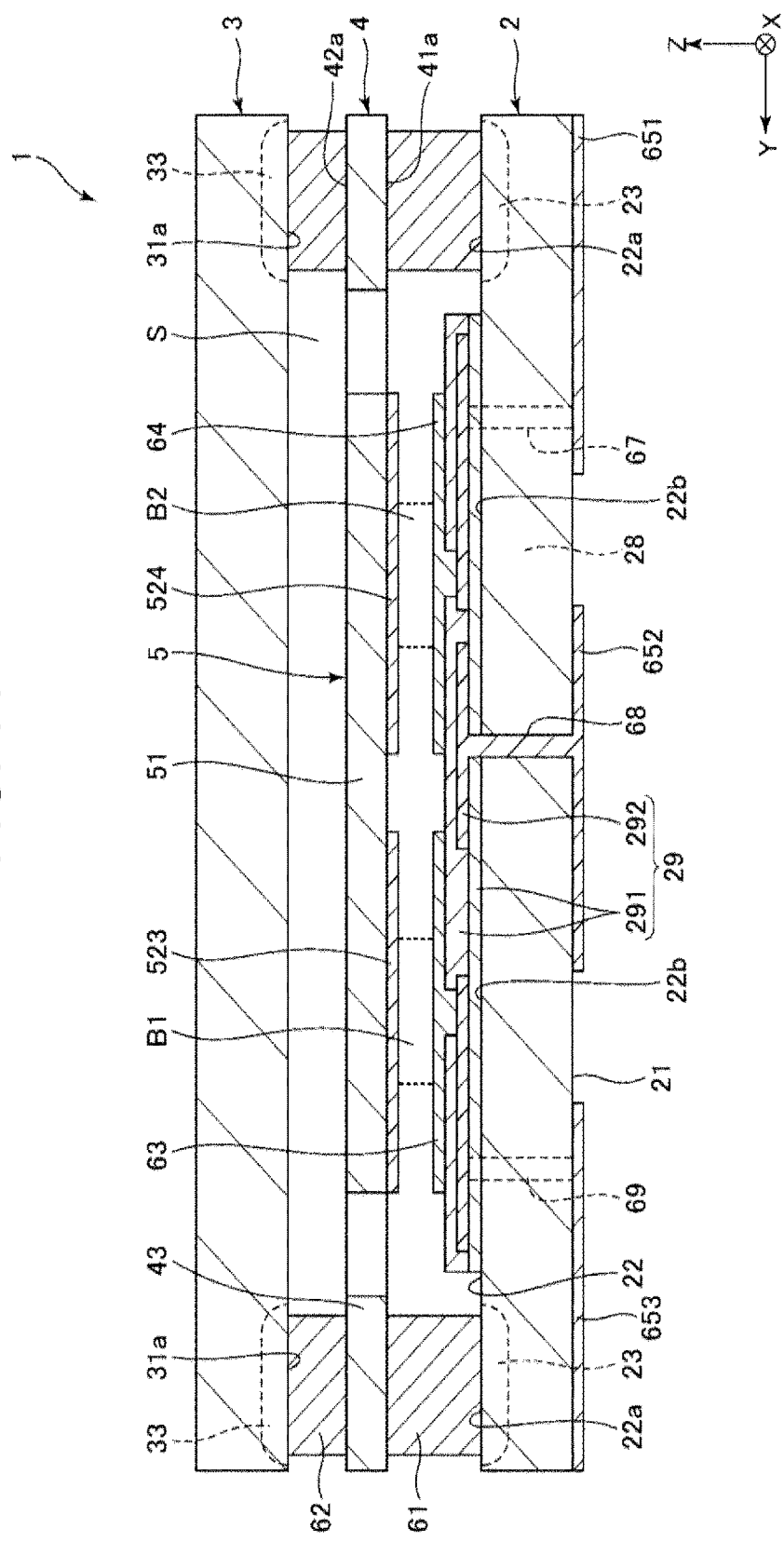
FIG. 14 is a cross-sectional view illustrating a vibration device in a fourth embodiment.

FIG. 14 is a cross-sectional view illustrating a vibration device in a fourth embodiment.

A vibration device 1 in the present embodiment is mainly the same as the vibration device 1 in the third embodiment except that the upper surface 22 of the base substrate 2 is an active surface. In the descriptions below, the vibration device 1 in the fourth embodiment will be described focusing on the differences from that in the third embodiment described above, and the description of the same items will not be repeated. In addition, in FIG. 14, the same reference symbols will be given to the same configurations in the embodiment described above.

As illustrated in FIG. 14, in the vibration device 1 in the present embodiment, a circuit 28 electrically coupled to the vibration element 5 is formed on the base substrate 2, and the upper surface 22 is an active surface. In addition, a laminate 29 in which an insulation layer 291 and a wiring layer 292 are alternately laminated is provided on the upper surface 22 of the base substrate 2, and a plurality of circuit elements (not illustrated) formed on the upper surface 22 are electrically coupled via the wiring layer 292, and then, the circuit 28 is configured. The laminate 29 is not formed on the coupling surface 22a of the base substrate 2 coupled to the first joining member 61, and thus, the upper surface 22 of the base substrate 2 is exposed. In this way, the base substrate 2 and the first joining member 61 can be brought into ohmic contact as in the third embodiment described above.

In addition, internal coupling terminals 63 and 64 that are electrically coupled to the circuit 28 via a wiring layer 292 are provided on the upper surface of the laminate 29. The bumps B1 and B2 indicated by dashed lines in FIG. 14 are in contact with the coupling surfaces 22b and 22b respectively at positions different from the internal coupling terminals 63 and 64 in plan view, and are electrically coupled to the internal coupling terminals 63 and 64 via the coupling surfaces 22b and 22b. In addition, three external coupling terminals 651, 652, and 653 are provided on the lower surface 21 of the base substrate 2. The external coupling terminals 651, 652, and 653 are electrically coupled to the wiring layer 292 via the through-electrodes 67, 68, and 69. In this way, by making the upper surface 22 of the base substrate 2 the active surface, the electrical coupling between the circuit 28 and the internal coupling terminals 63 and 64 can be easily performed via the wiring layer 292.

As described above, in the vibration device 1 in the present embodiment, the upper surface 22 of the base substrate 2 is an active surface, and the circuit 28 is electrically coupled to the external coupling terminals 651, 652, and 653 via the through-electrodes 67, 68, and 69 extending through the lower surface 21 and the upper surface 22 of the base substrate 2. In this way, it becomes easy to electrically couple the circuit 28 and external coupling terminals 651, 652, and 653. In addition, by making the upper surface 22 an active surface, the internal coupling terminals 63 and 64 can be easily disposed on the upper surface 22 side.

Fifth Embodiment

Figure 15:
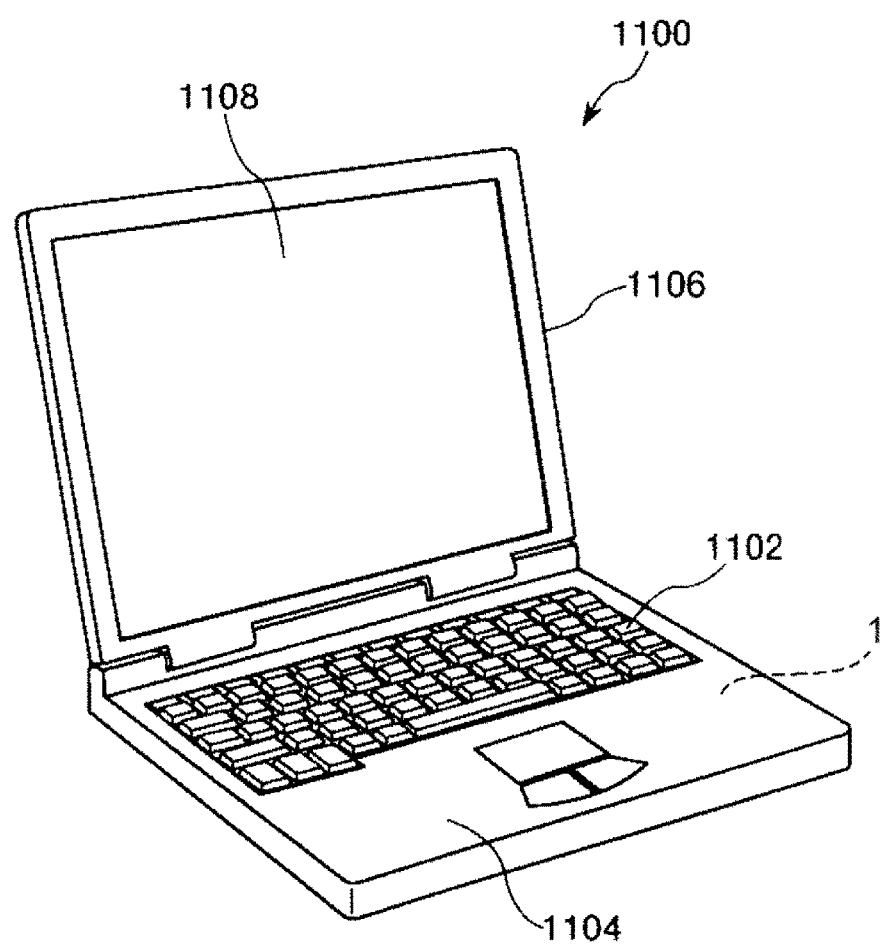
FIG. 15 is a perspective view illustrating an electronic apparatus in a fifth embodiment.

FIG. 15 is a perspective view illustrating an electronic apparatus in a fifth embodiment.

A laptop type personal computer 1100 illustrated in FIG. 15 is an application of an electronic apparatus including the vibration device in the embodiments described above. In the figure, the personal computer 1100 is configured to include a main body 1104 having a keyboard 1102 and a display unit 1106 having a displayer 1108, and the display unit 1106 is rotatably supported by the main body 1104 via a hinge structure. The vibration device 1 used as an oscillator, for example is incorporated in such a personal computer 1100.

In addition, the personal computer 1100 includes an arithmetic processing circuit that performs arithmetic processing relating to a control of the keyboard 1102 and the displayer 1108. The arithmetic processing circuit operates based on an oscillation signal output from the oscillation circuit of the vibration device 1.

As described above, the personal computer 1100 as the electronic apparatus includes the vibration device 1 and the arithmetic processing circuit that operates based on the oscillation signal output from the vibration device 1. Therefore, it is possible to exhibit a high reliability while enjoying the effects of the vibration device 1 described above.

Sixth Embodiment

Figure 16:
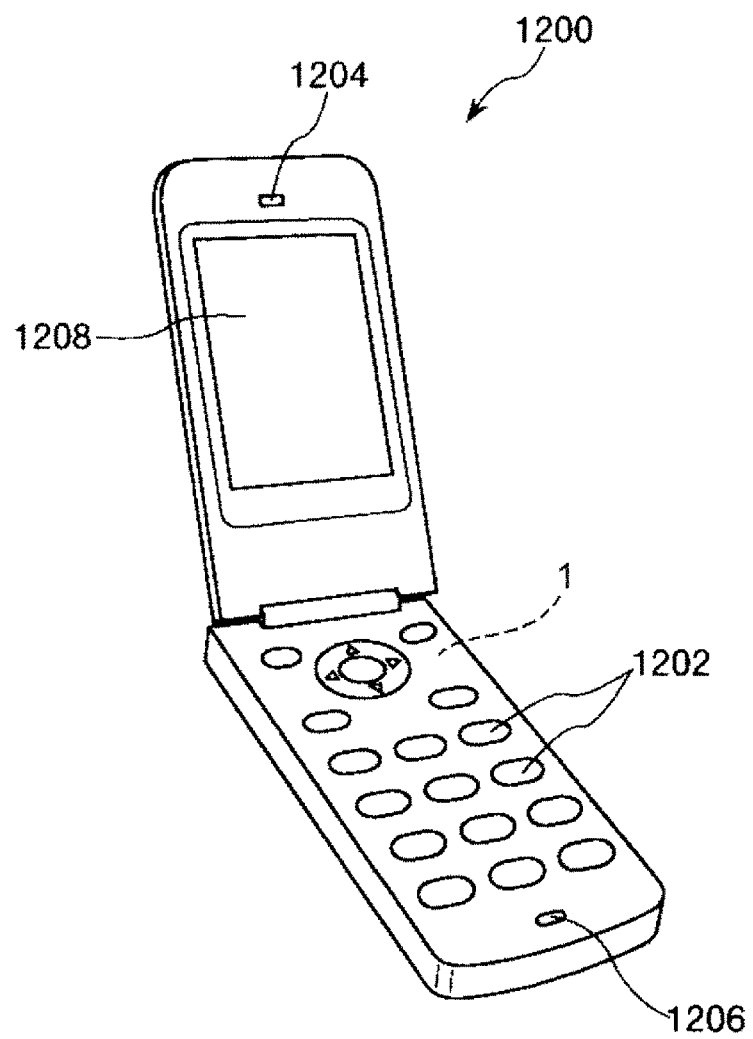
FIG. 16 is a perspective view illustrating an electronic apparatus in a sixth embodiment.

FIG. 16 is a perspective view illustrating an electronic apparatus in a sixth embodiment.

A mobile phone 1200 illustrated in FIG. 16 is an application of an electronic apparatus including the vibration device in the embodiments described above. The mobile phone 1200 includes an antenna, a plurality of operation buttons 1202, an earpiece 1204, and a mouthpiece 1206. The displayer 1208 is disposed between the operation buttons 1202 and the earpiece 1204. The vibration device 1 used as an oscillator, for example is incorporated in such a mobile phone 1200.

In addition, the mobile phone 1200 includes an arithmetic processing circuit that performs arithmetic processing relating to a control of the operation button 1202 and the like. The arithmetic processing circuit operates based on an oscillation signal output from the oscillation circuit of the vibration device 1.

As described above, the mobile phone 1200 as the electronic apparatus includes the vibration device 1 and the arithmetic processing circuit that operates based on the oscillation signal output from the vibration device 1. Therefore, it is possible to exhibit a high reliability while enjoying the effects of the vibration device 1 described above.

Seventh Embodiment

Figure 17:
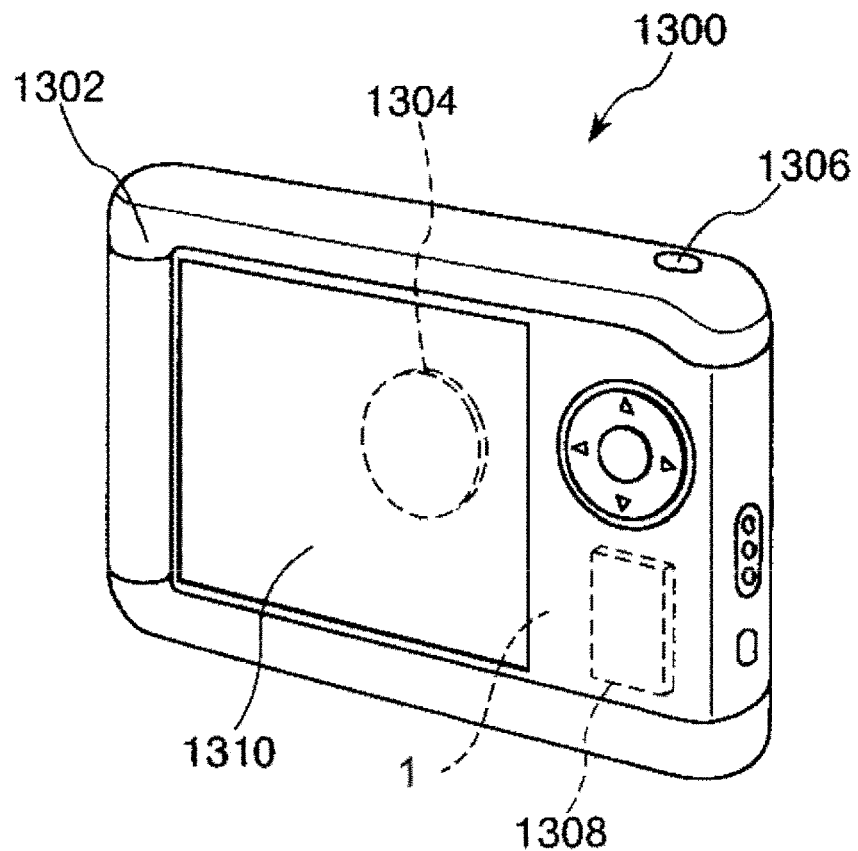
FIG. 17 is a perspective view illustrating an electronic apparatus in a seventh embodiment.

FIG. 17 is a perspective view illustrating an electronic apparatus in a seventh embodiment.

A digital still camera 1300 illustrated in FIG. 17 is an application of an electronic apparatus including the vibration device in the embodiments described above. A displayer 1310 is provided on a rear surface of a body 1302, and is configured to perform display based on an imaging signal from a CCD. The displayer 1310 functions as a finder that displays an object as an electronic image. In addition, a light receiving unit 1304 including an optical lens and the CCD is provided on the front side (the back side in the drawing) of the body 1302. When a photographer confirms a subject image displayed on the displayer 1310 and presses a shutter button 1306, an imaging signal at that time from the CCD is transferred and stored in the memory 1308. The vibration device 1 used as an oscillator, for example is incorporated in such a digital still camera 1300.

In addition, the digital still camera 1300 includes an arithmetic processing circuit that performs arithmetic processing relating to controlling a displayer 1310 and the light receiving unit 1304. The arithmetic processing circuit operates based on an oscillation signal output from the oscillation circuit of the vibration device 1.

As described above, the digital still camera 1300 as the electronic apparatus includes the vibration device 1 and the arithmetic processing circuit that operates based on the oscillation signal output from the vibration device 1. Therefore, it is possible to exhibit a high reliability while enjoying the effects of the vibration device 1 described above.

In addition to the personal computer, the mobile phone, and the digital still camera described above, the present disclosure can be applied to the electronic apparatuses such as: smartphones, tablet terminals, watches (including smart watches), inkjet discharge devices (for example, inkjet printers), laptop personal computers, television systems, wearable terminals such as head mounted displays (HMDs), video cameras, video tape recorders, car navigation devices, pagers, electronic notebooks (including communication functions), electronic dictionaries, electronic calculators, electronic game devices, word processors, workstations, videophones, crime prevention TV monitors, electronic binoculars, POS terminals, medical devices (for example, electronic thermometers, blood pressure monitor, blood glucose meter, electrocardiogram measuring device, ultrasonic diagnostic device, electronic endoscope), fish detector, various measuring equipment, mobile terminal base station equipment, instrumentation (for example, instrumentations for an automobile, an aircraft, a ship), flight simulation recorder, a network server, and the like.

Eighth Embodiment

Figure 18:
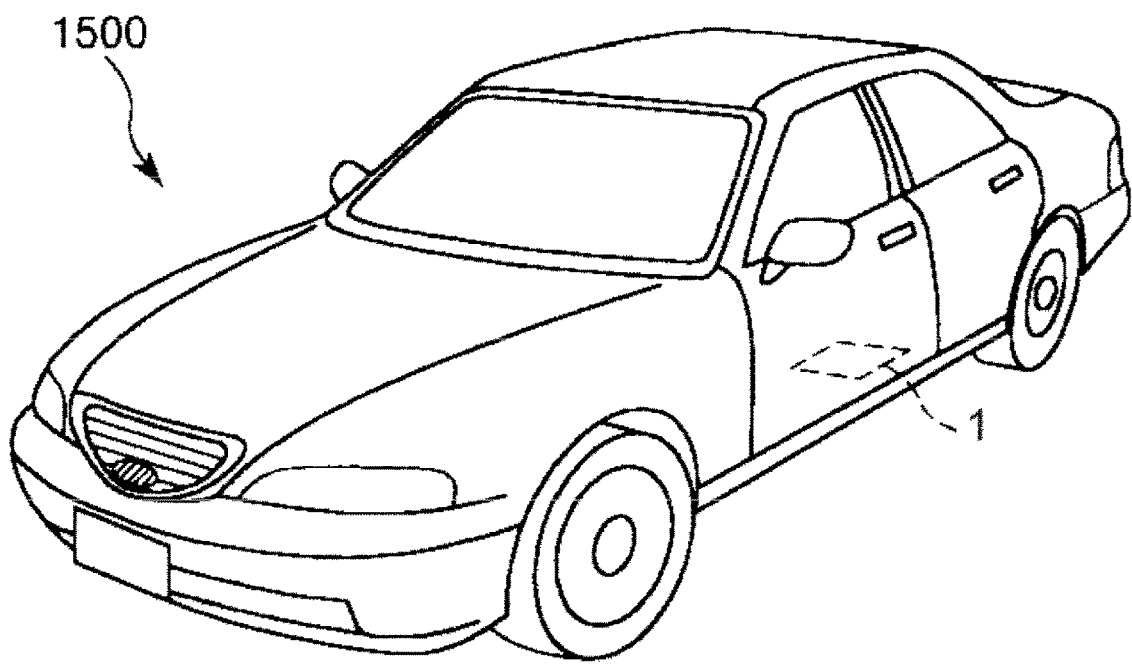
FIG. 18 is a perspective view illustrating a vehicle in an eighth embodiment.

FIG. 18 is a perspective view illustrating a vehicle in an eighth embodiment.

An automobile 1500 illustrated in FIG. 18 is an automobile to which a vehicle including the vibration device in the embodiments described above is applied. The vibration device 1 used as an oscillator and an arithmetic processing circuit that operates based on an oscillation signal output from an oscillation circuit of the vibration device 1 are incorporated in the automobile 1500. The vibration device 1 and the arithmetic processing circuit described above can be widely applied to, for example, a keyless entry, an immobilizer, a car navigation system, a car air conditioner, an anti-lock brake system (ABS), an airbag, a tire pressure monitoring system (TPMS), an engine control, a battery monitor for a hybrid automobile and an electric automobile, an electronic control unit (ECU) such as a body posture control system.

As described above, the automobile 1500 as the vehicle includes the vibration device 1 and the arithmetic processing circuit that operates based on the oscillation signal output from the vibration device 1. Therefore, it is possible to exhibit a high reliability while enjoying the effects of the vibration device 1 described above.

The vehicle is not limited to the automobile 1500, and also can be applied to an airplane, a ship, an AGV (automated guided vehicle), a biped robot, an unmanned airplane such as a drone, and the like.

As described above, the vibration device, the electronic apparatuses, and the vehicles have been described based on the illustrated embodiment, however, the present disclosure is not limited thereto, and the configuration of each part can be replaced with any configuration having the same function. In addition, any other components may be added to the present disclosure. Furthermore, the present disclosure may be a combination of any two or more configurations in the embodiments described above.

What is claimed is:
1. A vibration device comprising:
a first substrate that includes a first surface and a second surface opposite to the first surface;
a second substrate that includes a third surface and a fourth surface opposite to the third surface;
an intermediate substrate that is disposed between the first substrate and the second substrate and that includes a vibration element, a frame surrounding the vibration element, and a coupler linking the vibration element and the frame;
a conductive first joining member that is located between the frame and the first substrate and that joins the frame and the second surface;
a conductive second joining member that is located between the frame and the second substrate and that joins the frame and the third surface;
an internal electrode disposed on the first substrate; and
a first conductive member that is disposed between the first substrate and the intermediate substrate and that electrically couples the vibration element and the internal electrode, wherein
the first substrate is a semiconductor substrate,
the first substrate further including an oscillation circuit that is electrically coupled to the vibration element via the internal electrode,
a first external terminal that is disposed on the first surface and that is electrically coupled to the oscillation circuit and that has a fixed potential,
a second external terminal that is disposed on the first surface and that is electrically coupled to the oscillation circuit and to which supply power is input, and
a third external terminal that is disposed on the first surface and that is electrically coupled to the oscillation circuit and from which an oscillation signal is output from the oscillation circuit, and
the first joining member is electrically coupled to the first external terminal.
2. The vibration device according to claim 1, wherein
a coupling surface of the first substrate to be coupled to the first joining member and a coupling surface of the frame to be coupled to the first joining member are flat.
3. The vibration device according to claim 1, wherein
a coupling surface of the second substrate to be coupled to the second joining member and a coupling surface of the frame to be coupled to the second joining member are flat.
4. The vibration device according to claim 1, wherein
the oscillation circuit is disposed on the second surface of the first substrate, and is electrically coupled to the first external terminal, the second external terminal, and the third external terminal via at least one through-electrode extending through the first surface and second surface of the first substrate.
5. The vibration device according to claim 1, wherein
the oscillation circuit is disposed on the first surface of the first substrate,
the internal electrode is a through-electrode extending through the first surface and the second surface of the first substrate, and
the oscillation circuit is electrically coupled to the vibration element via the through-electrode.
6. The vibration device according to claim 1, wherein
the first joining member and the second joining member are electrically coupled, and
the second substrate is a semiconductor substrate electrically coupled to the first substrate via the first joining member and the second joining member.
7. An electronic apparatus comprising:
the vibration device according to claim 1; and
a processing circuit that operates based on the oscillation signal output from the vibration device.
8. A vehicle comprising:
the vibration device according to claim 1; and
a processing circuit that operates based on the oscillation signal output from the vibration device.
9. A vibration device comprising:
a first substrate that includes a first surface and a second surface opposite to the first surface;
a second substrate that includes a third surface and a fourth surface opposite to the third surface;
an intermediate substrate that is disposed between the first substrate and the second substrate and that includes a vibration element, a frame surrounding the vibration element, and a coupler linking the vibration element and the frame;
a conductive first joining member that is located between the frame and the first substrate and that joins the frame and the second surface;

a conductive second joining member that is located between the frame and the second substrate and that joins the frame and the third surface;
an internal electrode disposed on the first substrate; and
a first conductive member that is disposed between the first substrate and the intermediate substrate and that electrically couples the vibration element and the internal electrode, wherein
a coupling surface of the first substrate to be coupled to the first conductive member and a coupling surface of the first substrate to be coupled to the first joining member are flush with each other, and
a coupling surface of the intermediate substrate coupled to the first conductive member and a coupling surface of the intermediate substrate to be coupled to the first joining member are flush with each other.

10. The vibration device according to claim 9, wherein the first substrate is a semiconductor substrate,
the first substrate further including
an oscillation circuit that is electrically coupled to the vibration element via the internal electrode,
a first external terminal that is disposed on the first surface and that is electrically coupled to the oscillation circuit and that has a fixed potential,
a second external terminal that is disposed on the first surface and that is electrically coupled to the oscillation circuit and to which supply power is input, and
a third external terminal that is disposed on the first surface and that is electrically coupled to the oscillation circuit and from which an oscillation signal is output from the oscillation circuit, and
the first joining member is electrically coupled to the first external terminal.

11. The vibration device according to claim 10, wherein the oscillation circuit is disposed on the second surface of the first substrate, and is electrically coupled to the first external terminal, the second external terminal, and the third external terminal via at least one through-electrode extending through the first surface and second surface of the first substrate.

12. The vibration device according to claim 10, wherein the oscillation circuit is disposed on the first surface of the first substrate,
the internal electrode is a through-electrode extending through the first surface and the second surface of the first substrate, and
the oscillation circuit is electrically coupled to the vibration element via the through-electrode.

13. The vibration device according to claim 10, wherein
the first joining member and the second joining member are electrically coupled, and
the second substrate is a semiconductor substrate electrically coupled to the first substrate via the first joining member and the second joining member.

14. The vibration device according to claim 9, further comprising:
a second conductive member that is disposed between the second substrate and the intermediate substrate and that overlaps the first conductive member in a plan view of the first substrate.

15. A vibration device comprising:
a first substrate that includes a first surface and a second surface opposite to the first surface;
a second substrate that includes a third surface and a fourth surface opposite to the third surface;
an intermediate substrate that is disposed between the first substrate and the second substrate and that includes a vibration element, a frame surrounding the vibration element, and a coupler linking the vibration element and the frame;
a conductive first joining member that is located between the frame and the first substrate and that joins the frame and the second surface;
a conductive second joining member that is located between the frame and the second substrate and that joins the frame and the third surface;
an internal electrode disposed on the first substrate; and
a first conductive member that is disposed between the first substrate and the intermediate substrate and that electrically couples the vibration element and the internal electrode, further comprising:
a second conductive member that is disposed between the second substrate and the intermediate substrate and that overlaps the first conductive member in a plan view of the first substrate.

* * * * *